United States Patent [19]

Kou et al.

[11] Patent Number: 5,217,565
[45] Date of Patent: Jun. 8, 1993

[54] CONTACTLESS HEATER FLOATING ZONE REFINING AND CRYSTAL GROWTH

[75] Inventors: Sindo Kou; Chung-Wen Lan, both of Madison, Wis.

[73] Assignee: Wisconsin Alumni Research Foundation, Madison, Wis.

[21] Appl. No.: 791,906

[22] Filed: Nov. 13, 1991

[51] Int. Cl.$^5$ .......................................... C30B 13/00
[52] U.S. Cl. ............................ 156/620.74; 156/620.7; 156/620.71; 156/620.73; 156/DIG. 64
[58] Field of Search .......... 156/620.7, 620.71, 620.73, 156/620.74, DIG. 64

[56] References Cited

U.S. PATENT DOCUMENTS

| | | | |
|---|---|---|---|
| 2,964,396 | 12/1960 | Rummel et al. | 156/620.73 |
| 3,160,478 | 12/1964 | Rummel et al. | 23/273 |
| 3,179,593 | 4/1965 | Reuschel | 252/62.3 |
| 3,232,745 | 2/1966 | Rummel et al. | 156/620.73 |
| 3,235,339 | 2/1966 | Brunet et al. | 23/273 |
| 3,275,417 | 10/1963 | Hunt | 23/273 |
| 3,454,368 | 7/1969 | Keller et al. | 156/620.73 |
| 3,592,611 | 7/1971 | Eder et al. | 156/620.73 |
| 3,663,180 | 5/1972 | Brissot | 156/620.7 |
| 3,781,209 | 12/1973 | Reushel et al. | 156/620.71 |
| 4,045,183 | 8/1977 | Barowski et al. | 422/250 |
| 4,072,556 | 2/1978 | Schmidt | 156/620.73 |
| 4,080,172 | 3/1978 | Fricke, Jr. et al. | 422/249 |
| 4,176,002 | 11/1979 | Quenisset et al. | 156/601 |
| 4,258,009 | 3/1981 | De Leon et al. | 422/250 |
| 4,615,760 | 10/1986 | Dressler | 156/620.73 |
| 4,851,628 | 7/1989 | Ammon et al. | 156/620.73 |
| 5,114,528 | 5/1992 | Kou et al. | 156/616.1 |

OTHER PUBLICATIONS

W. G. Pfann, *Zone Melting*, 2d Edition, John Wiley & Sons, Inc., 1966, pp. 107–117.

J. C. Brice, *The Growth of Crystals from Liquids*, North-Holland Publishing Company, 1973, pp. 269–274.

A. Eyer et al., "A Double-Ellipsoid Mirror Furnace For Zone Crystallization Experiments in Spacelab", Journal of Crystal Growth, vol. 47, 1979, pp. 219–229.

R. Geray, et al., "Heating With Light," Cornell Engineering Quarterly, Autumn 1991, pp. 19–22.

C. W. Lan and Sindo Kou, "Floating-Zone Crystal Growth With a Heated Ring Covering the Melt Surface," Journal of Crystal Growth, vol. 108, Feb. 1991, pp. 1–7.

D. B. Gasson, "The Preparation of Calcium Tungstate Crystals by a Modified Floating Zone Recrystallization Technique," J. Sci. Instrum., 1965, vol. 42, pp. 114–115.

*Primary Examiner*—Robert Kunemund
*Assistant Examiner*—Fehisa Garrett
*Attorney, Agent, or Firm*—Foley & Lardner

[57] ABSTRACT

Floating zone refining or crystal growth is carried out by providing rapid relative rotation of a feed rod and finish rod while providing heat to the junction between the two rods so that significant forced convection occurs in the melt zone between the two rods. The forced convection distributes heat in the melt zone to allow the rods to be melted through with a much shorter melt zone length than possible utilizing conventional floating zone processes. One of the rods can be rotated with respect to the other, or both rods can be counter-rotated, with typical relative rotational speeds of the rods ranging from 200 revolutions per minute (RPM) to 400 RPM or greater. Zone refining or crystal growth is carried out by traversing the melt zone through the feed rod.

36 Claims, 6 Drawing Sheets

CONTACTLESS HEATER FLOATING ZONE REFINING AND CRYSTAL GROWTH

This invention was made with United States government support awarded by NASA headquarters (NASA), Grant #NAG8-705. The United States government has certain rights in this invention.

FIELD OF THE INVENTION

This invention relates to apparatuses and methods employed in the growing of a monocrystalline structure from polycrystalline material and to zone refining of various materials.

BACKGROUND OF THE INVENTION

Monocrystalline material is used in the manufacture of a wide variety of products, such as electrical circuitry, optical systems, and other microminiature devices. There are a number of methods that are utilized in the growth of a monocrystalline structure from a melt. A synopsis of some of the more significant methods is given below.

The Czochralski method involves the melting of a polycrystalline charge in a crucible by radio frequency induction or resistance heating. A monocrystalline seed is then lowered into the melt while being rotated in a clockwise direction. The crucible and its charge are rotated in a counterclockwise direction. The seed crystal is withdrawn at a slow rate from the melt until the desired diameter of the pulled monocrystalline structure is obtained. The pull speed is increased to maintain the desired diameter of the pull. This procedure continues as long as there is melt remaining in the crucible. One problem encountered with the Czochralski method is that of controlling the cross-sectional area of the crystal. While a circular cross-section is produced, the diameter of the crystal has a tendency to vary widely as the growth proceeds. An additional disadvantage is that the monocrystalline structure pulled from the charge may be contaminated by the material of the crucible.

The Stepanov method (See A. V. Stepanov, *Bull. Acad. Sci. USSR*, vol. 33 (1969), p. 1775) is a modification of the conventional Czochralski method. By the Stepanov method, a die member is mounted at a fixed position within the crucible such that the upper edges of the die are above the surface of the melt and the bottom of the die is well below the surface of the melt. The key to Stepanov's technique is shaping a melt column, and the melt column shape is used to control the crystal shape. See H. E. LaBelle, Jr., *J. Crystal Growth*, Vol. 50, 1980, p. 8. A difficulty with the Stepanov method is that constant control of the melt level in the crucible is required, as the level of the melt and hence the shape of the melt column will vary upon formation of the crystal.

In the edge-defined, film-fed growth (EFG) technique, the shape of the crystalline body is determined by the external or edge configuration of the end surface of a forming member or die. An advantage of the process is that bodies of selected shapes such as round tubes or flat ribbons can be produced. The process involves growth on a seed from a liquid film of feed material sandwiched between the growing body and the end surface of the die, with the liquid in the film being continuously replenished from a suitable melt reservoir via one or more capillaries in the die member. By appropriately controlling the pulling speed of the growing body and the temperature of the liquid film, the film can be made to spread (under the influence of the surface tension at its periphery) across the full expanse of the end surface of the die until it reaches the perimeter or perimeters thereof formed by intersection of that surface with the side surface or surfaces of the die. The angle of intersection of the aforesaid surfaces of the die is such relative to the contact angle of the liquid film that the liquid's surface tension will prevent it from overrunning the edge or edges of the die's end surface. The growing body grows to the shape of the film which conforms to the edge configuration of the die's end surface.

The Bridgman-Stockbarger method utilizes an elongated container of material which is melted in a high temperature furnace, after which the container is lowered into a cooler, lower temperature furnace, which allows the material to slowly resolidify as a single crystal. The molten material from which the crystal is grown is completely enclosed during the process, and as a result, strains occur in the material which induce defects when the molten material solidifies.

Float zone refining is another method used to convert polycrystalline material to a high quality monocrystalline rod and, simultaneously, to remove unwanted impurities from the material. In the float zone technique a narrow molten zone is caused to move slowly along the length of a vertically disposed rod of polycrystalline material. As the molten zone moves, the material immediately behind the zone resolidifes as monocrystalline material. The monocrystalline growth is initially nucleated by a single crystal seed and then continues in a self-seeding manner. Impurities in the material tend to congregate in front of the molten zone so that as the molten zone moves, the zone also removes impurities with it, leaving the material behind the zone in a purer state.

In the float zone process with a contactless heater, the molten zone is caused to traverse the length of the polycrystalline rod by moving the rod vertically downward past a stationary heating means such as a radio frequency induction coil that surrounds a material in the contactless manner. In an alternate embodiment of the float zone refining process with a contactless heater, the rod is stationary and the heater moves vertically across the length of the rod. In addition to the translational motion, a rotational motion may also be imparted to improve crystal perfection and uniformity. The float zone process with a contactless heater, while producing a clean monocrystalline result, is very unstable in that the melt zone tends to collapse. Other difficulties in the float zone process with a contactless heater include the presence of a strong thermocapillary flow in the melt that results in banding and the fact that the melt/crystal interface is convex (rather than flat) toward the melt, resulting in solute segregation and dislocations.

The floating-zone process has been used to grow single crystals from a wide variety of materials, including those for electronic and optical applications. It is a containerless process, and for this reason contamination-free single crystals can be grown. This process has also been used extensively for refining. After the melt zone has passed through a sample rod for a number of times, an extremely pure material can be obtained.

The effect of the zone length on the stability of the floating zone is illustrated in FIG. 1. The zone length herein refers to the vertical distance between the melt-/solid interfaces at the free surface. Since the melt zone is self-supported by the surface tension of the melt, its stability is rather limited. The stability of the melt zone is, therefore, the most critical issue in floating-zone crystal growth and refining. As illustrated in FIG. 1, an excessive zone length can cause the melt to break out and the melt zone to collapse. The severe distortion of the free surface is a clear indication of poor zone stability.

The stability of the melt zone has been analyzed theoretically by several investigators, based on various simplifying assumptions such as no convection in the melt and flat melt/solid interfaces. Most of these theoretical analyses suggest that the maximum allowable zone length is proportional to $(\gamma/\rho g)^{\frac{1}{2}}$, where $\gamma$ is the surface tension of the melt, $\rho$ the density of the melt and $g$ the gravitational acceleration.

Coriell et al., *J. Crystal Growth*, vol. 42, 1977, p. 466, have calculated the free surface shape of the melt zone as a function of the Bond number and the zone aspect ratio. They have also investigated the stability of various interface shapes. Recently, their work has been extended by Riahi et al., *J. Crystal Growth*, vol. 94, 1989, p. 635, and Lie et al., *Physico-Chemical Hydrodynamics*, vol. 10, 1988, p. 441, to include the electromagnetic force exerted by an induction-coil heater on the melt zone.

Attempts have been made to improve zone stability. Induction coils have been designed to help levitate the melt zone (e.g., See W. Keller and A. Mubebauer, *Floating-Zone Silicon*, Marcel Dekker, Inc., New York, 1981). Electromagnetic levitation has also been employed in laboratory experiments. See, e.g., W.G. Pfann, *Zone Melting*. 2d Edition, John Wiley and Sons, Inc., New York, 1966, p. 116. These techniques, however, are limited to electrically conducting materials. Induction coils have been widely used in the growth of silicon crystals. Due to the exceptionally high $\gamma/\rho$ ratio of the silicon melt, silicon single crystals of very large diameters, e.g., 75 mm, have been grown, as described in Keller and Mubebauer, supra.

SUMMARY OF THE INVENTION

In accordance with the present invention, floating zone refining or crystal growth is carried out by rapidly rotating the feed rod and finish rod (or grown crystal) relative to one another so that significant forced convection occurs in the melt zone between the two rods. The forced convection of melt material in the melt zone distributes the heat applied to the melt into the interior of the melt zone to allow the rods to be melted through at the melt zone with a much shorter zone length than is possible utilizing conventional floating zone processes. In the present invention, the aspect ratio of the melt zone (length of the melt zone to diameter of the rods) is significantly less than one, preferably in the range of 0.7 or less, whereas in conventional floating zone crystal growth and refining processes, the aspect ratio generally is at least about one.

In the process of the invention, the feed rod can be rotated with respect to a substantially stationary finish rod, or the finish rod can be rotated with respect to the feed rod, or the feed and finish rods can both be rotated in counter directions to one another. Generally, the relative rotational speed of one rod with respect to the other will be at least 200 revolutions per minute (rpm) and up to 400 rpm or greater. The relative rotational velocity of the rods with respect to one another required to obtain the shortened aspect ratio for the floating zone of the present invention will depend on the characteristics of the material of the rods and the diameter of the rods. Rapid relative rotation of the rods in accordance with the present invention produces centrifugal forces within the melt zone which cause forced convection of the melt material from the free surface to the interior. The larger the diameter of the rods, the greater the centrifugal force experienced by the melt, and generally the lower will be the required relative rotational speed of the rods. The free surface of the melt zone is supported by the surface tension of the liquid melt. Since different materials have different surface tensions and densities, the relative rotational speed required to support a stable melt zone may vary from material to material. It is found that in the present invention, because of the convection of heat from the free surface to the interior, the temperature of the melt at the free surface required to melt the rods completely through is lower than that which is required in conventional floating zone processing. Generally, the speed of rotation and heat applied to the melt zone are selected so that the melt zone is stable (does not collapse), the melt/solid interfaces of the two rods do not contact one another, and the forced convection in the melt results in the center of the melt/solid interface for one rod (where one rod is rotated) or both rods (where the rods are counter-rotated) to be substantially flat rather than the typically pointed convex shape found in the conventional floating zone process. In the process of the present invention, the interfaces can actually become somewhat concave in larger diameter rods.

The present invention has several advantages over conventional floating zone processes. First, significantly larger and purer crystals can be grown which have a more uniform diameter. In addition, significantly larger and purer zone refined samples (not necessarily crystals) can be prepared which also have more uniform diameter. Third, the process of the invention does not require complicated sensors or control systems to control the temperature of the melt or the speed of rotation of the rods or the relative speed of movement of the melt zone through the materials, as is often required in conventional floating zone processes. Fourth, the present invention can be applied to both electrical conductors and non-conductors. Fifth, the shape of the growth front, that is, the melt/crystal interface, can be chosen by the manner in which the crystal rod (finish rod) or the feed rod are rotated relative to one another, as well as by selection of the direction of advance of the heater with respect to the rotating rods. Sixth, if the crystal is to be doped, the dopant will be distributed uniformly in the radial direction as a consequence of the vigorous convection in the melt. The so-called zone-leveling technique can be used to obtain a uniform dopant distribution in the axial direction of the crystal as in conventional floating zone processing.

In utilizing the process of the present invention in zone refining, the fast rotation or counter rotation of the rods relative to one another significantly enhances the agitation in the melt zone and hence the refining of the material. As is well known, the more vigorous the melt agitation, the better the refining will be. It is possible to obtain very highly refined samples by passing the melt zone repeatedly through a sample.

Porosity in the grown crystal can also be reduced or eliminated utilizing fast rotation in accordance with the invention. The feed rods for floating zone refining or crystal growth are often prepared by hot pressing, and hence contain lots of pores. Consequently, the melt and hence the growing crystals can contain gas pores. The fast rotation in accordance with the present invention is generally found to drive the gas bubbles out of the floating zone except where the process involves downward growth with single rotation of the lower (feed) rod.

In a preferred manner for carrying out the process of the invention, a feed rod and initial section of finish rod (which may be a crystal starter) are brought very close together but not in contact. Heat is then applied to the junction or interface between the rods, such as with a ring heater, to melt the adjacent faces of the two rods. The rods are then moved together, preferably with slow rotation of the rods relative to one another to insure a uniform distribution of the melt as the melt material on the faces of the two rods comes into contact. When a complete melt zone is established between the feed and finish rod, rapid relative rotation of the rods is established in accordance with the invention, and the melt zone is moved through the feed rod as by translating rods relative to the heater.

Further objects, features and advantages of the invention will be apparent from the following detailed description when taken in conjunction with the accompanying drawings.

BRIEF DESCRIPTION OF THE DRAWINGS

In the drawings:

FIG. 6 is a schematic view of a melt zone in a larger diameter single rod where the heat required to provide melt-through of the rod in conventional floating zone processing results in breakout of the melt material before the rod is completely melted through.

FIG. 7 is a schematic view of the large diameter rod of FIG. 6 wherein there is a separate feed rod and finish rod, the rods are rotated relative to one another, and a lower heat input is provided to the melt zone which nonetheless allows the rods at the melt zone to be completely melted through.

DETAILED DESCRIPTION OF THE INVENTION

Figure 1:
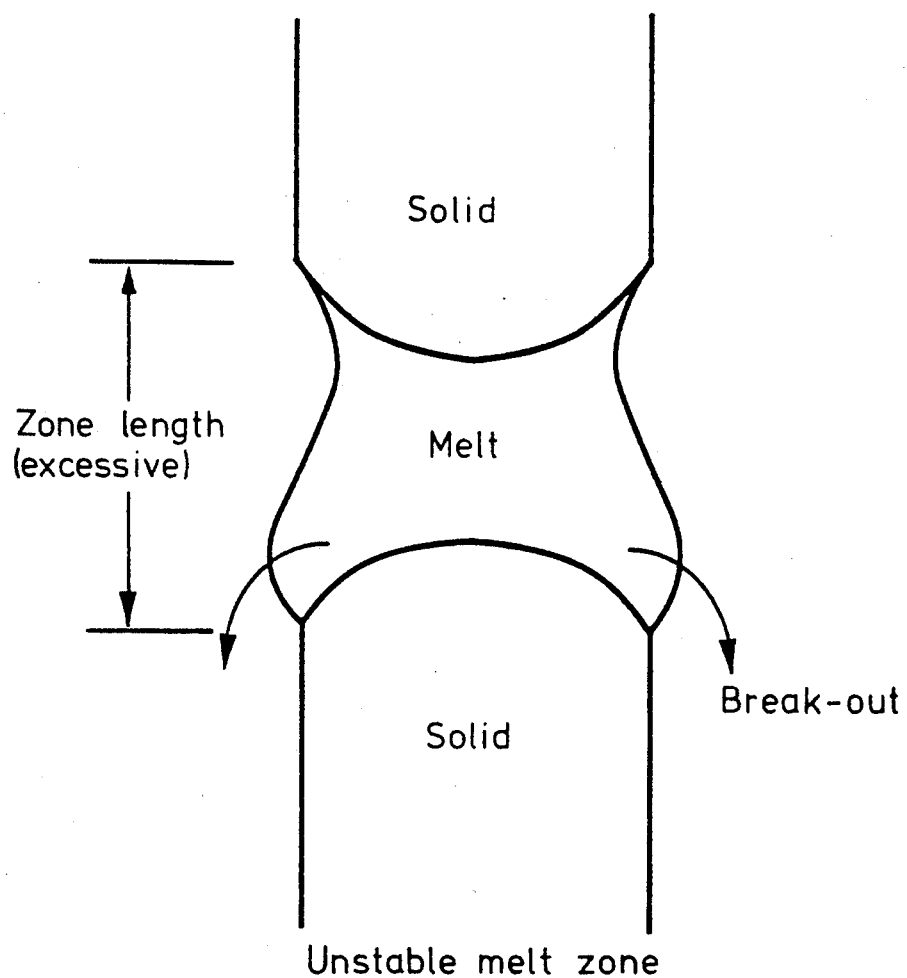
FIG. 1 is a schematic view of an unstable melt zone between two rods in the conventional floating zone process.
Figure 2:
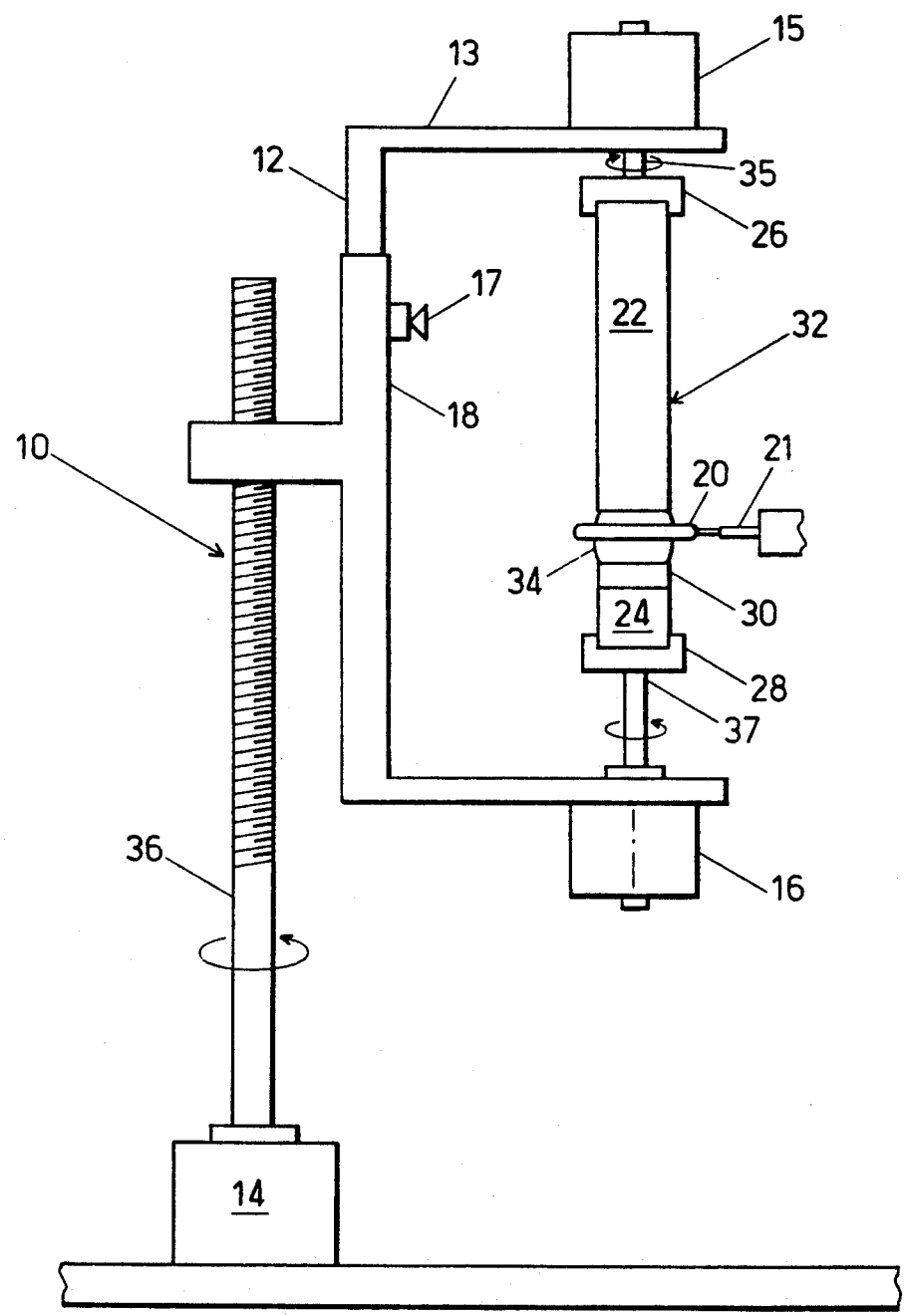
FIG. 2 is a simplified schematic view of apparatus for carrying out the present invention.

With reference to the drawings, a schematic side view of an apparatus for carrying out floating zone processing in accordance with the invention is shown generally at 10 in FIG. 2. The apparatus 10 includes a bracket 12, a drive motor 14 providing selected rotational motion, which has a shaft connected to a threaded output shaft 36, and electrical rotational drive motors 15 and 16 mounted on opposite ends of the bracket 12. The bracket 12 is mounted to the shaft 36 to translate up and down depending on the direction of rotation of the shaft 36 as driven by the motor 14. A feed rod 22, which may be a polycrystalline material, and a finish rod 24, which may initially be a seed crystal mass, are also mounted to the bracket 12 in a vertical orientation and meet one another at a melt zone 34 at the position of a heater 20, which may be a stationary mounted electrical ring heater as shown. The polycrystalline rod 22 and the finish rod 24 are held in place within the bracket 12 by end plates 26 and 28, respectively. Where the process is utilized to create a single crystal rod from a polycrystalline feed rod, the portion 24 of the finish rod is a seed crystal on which is grown a monocrystalline body 30 which grows as the molten zone 34 traverses the feed rod 22.

The material in the melt zone 34 is melted by heat from the heater 20, which may be an electrical resistance ring heater which has an inside diameter slightly larger than the outside diameter of the feed rod 22 and finish rod 24 and consequently of the melt zone 34 between them. The rods 22 and 24 are moved relative to the heater 20 and the corresponding melt zone 34 traverses the length of the rods by the action of the translational motor 14 rotating the output shaft 36 which mates with a threaded opening in the bracket 12, such that upon rotation of the output shaft 36 the bracket 12 translates vertically upwardly or downwardly. Translation of the bracket 12 upwardly or downwardly changes the relative position of the heater 20 with respect to the rods 22 and 24. The rods 22 and 24 are mounted for rotation by the spindles 35 and 37, which are attached to the end plates 26 and 28, respectively. The rotation of the feed rod 22 is controlled by the motor 15, and the rotation of the finish rod 24 is controlled independently by the motor 16. These motors may be conventional variable speed drive motors with associated control circuitry of standard design (not shown) to control the speed of rotation of the motors. Furthermore, the direction of rotation of the motors 15 and 16 is preferably controllable. It is understood that the arrangement of FIG. 2 is exemplary, in that relative translation of the heater 20 with respect to the rods 22 and 24 may be accomplished in other ways, such as by holding the rods 22 and 24 stationary and translating the heater 20 upwardly and downwardly. Moreover, it is also to be understood that the relative position of the feed rod 22 and finish rod 24 may be interchanged, and that the direction of crystal growth may be either upwardly or downwardly.

It is also understood that where it is only desired to rotate one of the rods with respect to the other rod, rather than have counter rotation of the rods, only one of the motors 15 or 16 may be required.

In carrying out the present process, the preferred procedure is initiated by mounting the feed rod 22 and the seed crystal or initial section 24 of the finish rod in their holders 26 and 28, respectively, with a gap between the facing ends of the rods 22 and 24. It is preferable that the apparatus of FIG. 2 be able to adjust the relative positions of the rods 22 and 24 with respect to one another, as shown for illustrative purposes by having a top portion 13 of the bracket 12 slide within a sleeve 18 in the bottom portion of the bracket, and be held in place by a lock screw 17. Any other suitable mechanism for adjusting the position of the rods may be used. The rods 22 and 24 are initially set at a position where the ends are spaced slightly apart, e.g., about 2 mm, and the ring heater 20 is positioned at the interface between the two rods. The heater is then provided with electricity through supply wires 21 to heat up to a temperature sufficient to melt the material of the rods 22 and 24 at their ends. When the ends of the rods 22 and 24 begin to melt, the top portion 13 of the bracket is moved slightly down to bring the feed rod 22 closer to the finish rod 24 until the melted materials of the feed rod and the finish rod 24 come into contact. During this time, the motor 15 or 16, or both, provide a slow relative rotation of the rods 22 and 24 with respect to one another, e.g., at about 5 rpm, to insure uniform mixing of the melt material when the melt from the ends of the two rods comes into contact. Upon establishment of the uniformly mixed melt between the two rods, the motors 15 or 16 or both are controlled to increase in speed to the desired relative rotational speed between the two rods 22 and 24, typically in the range of 200 rpm or greater. Upon establishment of the desired melt zone between the rods 22 and 24, the translation of the heater 20 with respect to the rods is carried out at an appropriate speed to result in either zone refining of the material of the rods or growth of single crystal 30.

Although not shown in FIG. 2, various standard sensors, such as thermocouples or infrared sensors, may be utilized to monitor the temperature of the melt zone and to control the power supplied to the heater 20 to maintain the melt zone at the desired surface temperature.

EXAMPLES—COUNTER ROTATION

For purposes of exemplifying the invention, examples utilizing sodium nitrate are described below. Sodium nitrate, $NaNO_3$, is particularly suitable for demonstrating crystal growth for several reasons. First, it is a nonconductor. Second, the melt of $NaNO_3$ is transparent, thus allowing convection in the melt zone and the melt/solid interfaces to be observed during crystal growth. Third, significant thermocapillary convection can be induced in its melt zone. Fourth, its physical properties are well documented. Fifth, $NaNO_3$ is relatively low in melting point (i.e., 307° C.) and its melt is stable in air (up to about 550° C.) As such, crystal growth can be conducted in open air and thus observed very closely. Sixth, single crystals of $NaNO_3$ and its close relative $NaNO_3$ have been used as optical materials, e.g., polarizing prisms.

In conventional floating zone crystal growth, the aspect ratio (length/diameter) of the melt zone for $NaNO_3$ and most other materials is typically about 1, whereas the present invention is found to provide aspect ratios significantly less than 1, e.g., 0.7 or less.

Polycrystalline $NaNO_3$ rods of 6 mm and 10 mm diameters were prepared by casting. The ring heaters were made of either a platinum or Kanthal wire. In the case of 6 mm rods, the inner diameter of the platinum ring was about 10 mm and the platinum wire diameter was 0.5 mm. In the case of 10 mm rods, the inner diameter of the ring was about 13.5 mm and the Kanthal wire diameter was 0.7 mm. An S type (Pt-Pt/10Rh) thermocouple of 0.05 mm diameter was spot welded to the ring heater for indication and control of the heater temperature. The variations in the heater temperature during a single run were around ±1° C. It was noted, however, that a heater with a tarnished surface could produce a melt zone significantly different from that produced by one with a shiny surface, even with an identical temperature setting.

Two polycrystalline rods (of the same diameter) were initially mounted in the apparatus lined up vertically with a small gap of about 2 mm to allow independent rotational motion of the two rods. After melting of the facing ends of both rods was initiated, the upper rod was lowered until the melt filled up the gap between the rods. The rods were then rotated and rotation speeds were controlled and measured with an optical tachometer. The variations in the rotational speeds during a run were around ±1 rpm. The heater was set to travel at about 1 cm/hr, either upwardly or downwardly.

A single 6 mm $NaNO_3$ rod was heated without rotation. The melt zone in the 6 mm diameter rod was found to be rather unstable The melt zone was about 5.5 mm (aspect ratio=0.92) and its free surface was significantly distorted. This unstable melt zone soon collapsed. The temperature of the ring heater was 940° C. throughout this experiment. With lower heater temperatures, the rod could not be melted through.

As noted, by using two rods instead of one and by counterrotating them at a sufficiently high speed, it is possible to reduce the heat input and hence shorten the melt zone, without causing its centerline to freeze. It was found that for two 6 mm diameter $NaNO_3$ rods with a counterrotation speed of either 200 or 400 rpm, a lower heater temperature of 920° C. could be used while still achieving a stable melt zone. It is interesting to note that this heater temperature is only 20° C. lower than that in the previous case with no counterrotation. However, without counterrotation of the rods this heater temperature is found to be too low to prevent the melt centerline from freezing. Where 400 rpm counterrotation (each rod rotated at 400 rpm) and 920° C. heater temperature was used, the melt zone was only about 3.3 mm long (aspect ratio =0.55) and was very stable. Interestingly, the melt/solid interfaces were essentially flat except for the convexity in small regions near the free surface. A flat growth front is often favorable in crystal growth. A similar melt zone was observed in the case of 200 rpm counterrotation of each rod.

Counterrotation was terminated during one experiment, after a short and very stable melt zone was established. The heater temperature, however, remained unchanged. It was observed that the melt centerline froze quickly but the free surface grew longer gradually.

Similar runs were also carried out with 10 mm diameter $NaNO_3$ rods. For a non-rotated 10 mm rod, the melt broke out long before the rod was even melted through. The temperature of the ring heater was 1000° C. at such time. However, by using two 10mm-diameter rods and counterrotating them at 200 rpm as described above, a melt zone was established at the same heater temperature. This melt zone was only about 4.2 mm long (aspect ratio=0.42) and very stable. When rotation was terminated, the melt/solid interfaces drew closer to each other near the centerline but became farther apart from each other near the free surface. The melt zone soon became too long (about 6.0 mm) and the melt broke out.

During some experiments the rotation of one of the two counterrotating rods was suddenly reversed, to cause both rods to rotate in the same direction and at the same speed, e.g., 200 rpm. The resulting melt zone in such corotating rods was long and the free surface highly distorted. It was thus found that corotation does not improve zone stability significantly.

EXAMPLES—SINGLE ROTATION

In another example, a melt zone was established between a stationary upper 6 mm NaNO$_3$ rod and a lower 6 mm rod rotating at 400 rpm. The melt zone was longer than that with counterrotation as described above but shorter than that without rotation. In fact, the melt zone was also very stable. A melt zone was also established between a stationary lower rod and an upper rod rotating at 400 rpm. The length and stability of this melt zone are similar to those of the melt zone where the lower rod rotates, but the shapes of the melt/sold interfaces are opposite.

A 0.05 cm diameter platinum wire was used to make a ring heater of about 1 cm inside diameter. Polycrystalline rods of 0.6 cm diameter were prepared by casting. Two polycrystalline rods were lined up vertically, with a small gap of about 0.2 cm left between the rods. As melting was being initiated, the rods were rotated very slowly to ensure uniform melting. After melting was initiated, the upper rod was gradually lowered until the melt filled up the gap between the rods. Single rotation of either the upper or lower rod at 400 rpm was then started, with the other rod being slowly rotated at about 5 rpm to insure uniform heating. The heater was then traversed at 1 cm/hr, upward for upward growth and downward for downward growth.

For a single crystal rod growing upwardly while being rotated at 400 rpm, the aspect ratio of the melt zone was about 0.7 and the growth front was slightly convex but still essentially flat.

For a single crystal rod growing upward, with the feed rod being rotated at 400 rpm, the aspect ratio of the melt zone was about 0.7 and the growth front was rather convex. For a single crystal growing downwardly while being rotated at 400 rpm, the aspect ratio of the melt zone was about 0.6 and the growth front was essentially flat.

It should be pointed out that with downward growth the heater temperature must be slightly reduced (e.g., from 920° C. to about 900° C.). Without this reduction, necking of the melt zone near the growth front was evident. This necking cause the crystal to grow smaller in diameter, and this in turn caused the melt volume to increase significantly and hence the melt zone to collapse eventually.

For a single crystal growing downwardly, with the feed rod being rotated at 400 rpm, the aspect ratio of the melt zone was about 0.6 and the growth front was rather convex.

Since the NaNO$_3$ melt was not degassed prior to casting, all feed rods contained gas porosity. Gas bubbles were released by the feed rod as it melted during crystal growth. It was observed that, once released, these bubbles were swept outward, upward and then inward as they approached the growth front. Due to the buoyancy force some of the bubbles stopped along the growth front like balloons against a roof. As crystal growth proceeded, these bubbles were "swallowed" by the growth front and became gas pores in the resulting crystal.

In conventional floating-zone crystal growth, a slow rotation (e.g., 30 rpm) of the feed rod and/or the crystal is often used. The purpose of this slow rotation is to ensure uniform heating of the melt zone, and in some cases, to attempt to reduce radial dopant segregation. The counterrotation or rotation of the rods in the present invention is, however, much faster and the purpose is to improve zone stability.

Figure 3:
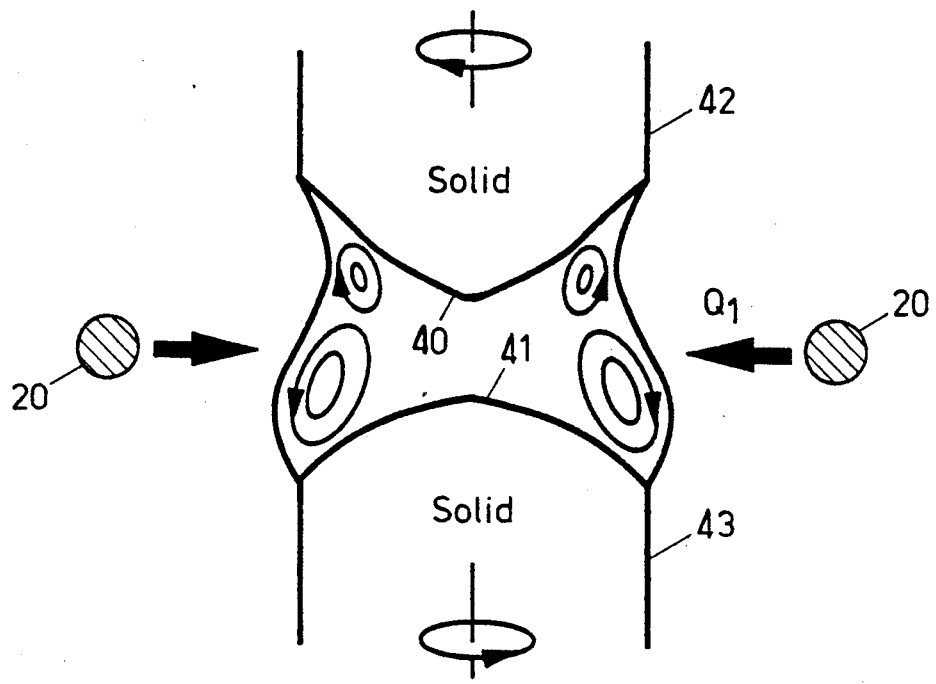
FIG. 3 is a schematic view of the melt zone between two rods with a particular level of heat input from the heater.
Figure 4:
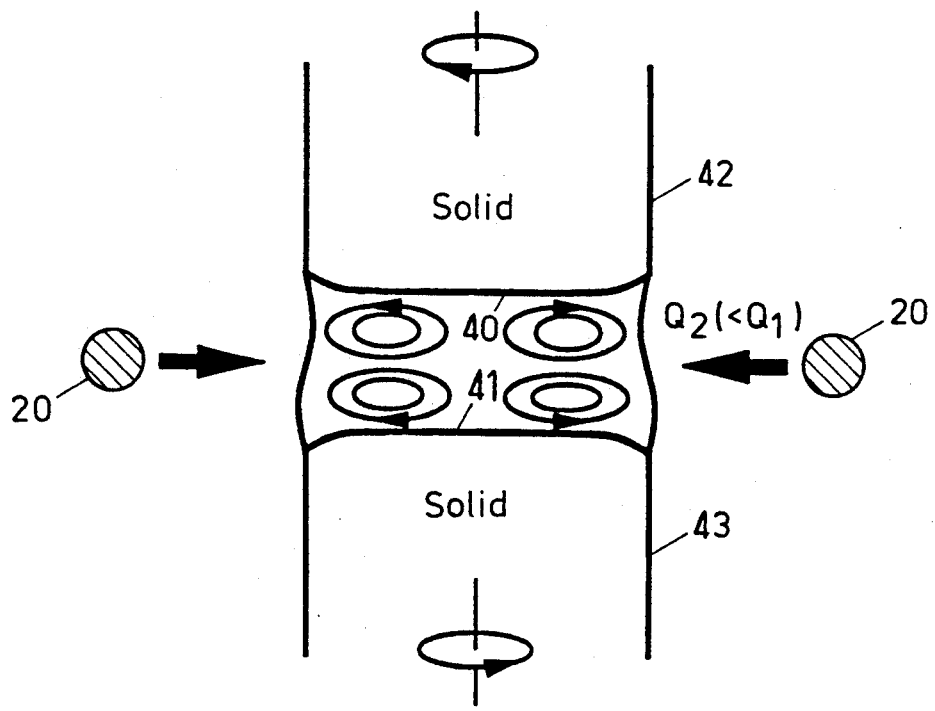
FIG. 4 is a schematic view of the melt zone in the rods as in FIG. 3 but with the rods rotated relative to one another and with the heat input reduced to reduce the temperature of the free surface of the melt and thereby provide a more stable melt zone.

The results for the case of 6 mm diameter rods can be summarized and explained with the help of FIGS. 3 and 4. It is well known that the surface tension ($\gamma$) of the melt of most pure materials tends to decrease with increasing temperature (T). For NaNO$_3$ melt, $d\gamma/dT = -0.056$ dyne cm$^{-1}$ °C.$^{-1}$. Referring to FIG. 3, significant temperature gradients exist along the longitudinal direction of the free surface, i.e., the surface temperature of the melt decreases as the melt/solid interfaces 40 and 41 of the rods 42 and 43 are approached. These temperature gradients induce surface-tension gradients along the free surface, so that the surface tension is higher near the melt/solid interfaces 40 and 41 and lower away from them. As a result, the melt is pulled along the free surface toward the melt/solid interfaces, the resultant convection being indicated by the flow loops in the melt. This thermocapillary convection is also called Maragoni convection, and has previously been observed to dominate (over natural convection) in the melt zone of NaNO$_3$. These Marangoni-convection flow loops cause the heat input ($Q_1$) to be transferred along the free surface to the melt/solid interfaces but discourage it from penetrating deep into the melt zone. As a result, the melt zone becomes too long and hence ultimately becomes unstable and collapses. The pointed convex interfaces 40 and 41 shown in FIG. 3 are characteristic of the dominance of Maragoni convection.

With counterrotation of the rods, convection in the melt is changed significantly, as illustrated in FIG. 4. The counterrotating rods exert a centrifugal force on the melt. This force is high near the melt/sold interfaces 40 and 41, but diminishes in the bulk melt. As a result, the melt is pushed radially outward near the melt/solid interfaces, but is allowed to turn back somewhere in the bulk of the melt. The resultant convection pattern in the melt is essentially like that sketched in FIG. 4, if the counterrotation is fast enough to let the forced convection dominate over Marangoni and natural convection. This convection pattern is similar to that observed by H. Chun, *J. Crystal Growth*, vol. 48, 1980, p. 600 in a silicone oil column between two copper discs of 3 mm diameter counterrotating at 1000 rpm.

The forced-convection flow loops are in the directions opposite to the Marangoni-convection flow loops. In fact, these forced-convection flow loops cause the heat input ($Q_2$) to penetrate deep into the melt zone and melt/solid interfaces. As a result, a smaller heat input ($Q_2$) is sufficient to melt through the material, and the melt zone is short and very stable. The melt/solid interfaces 40 and 41 are characteristically substantially flat at their centers.

Figure 5:
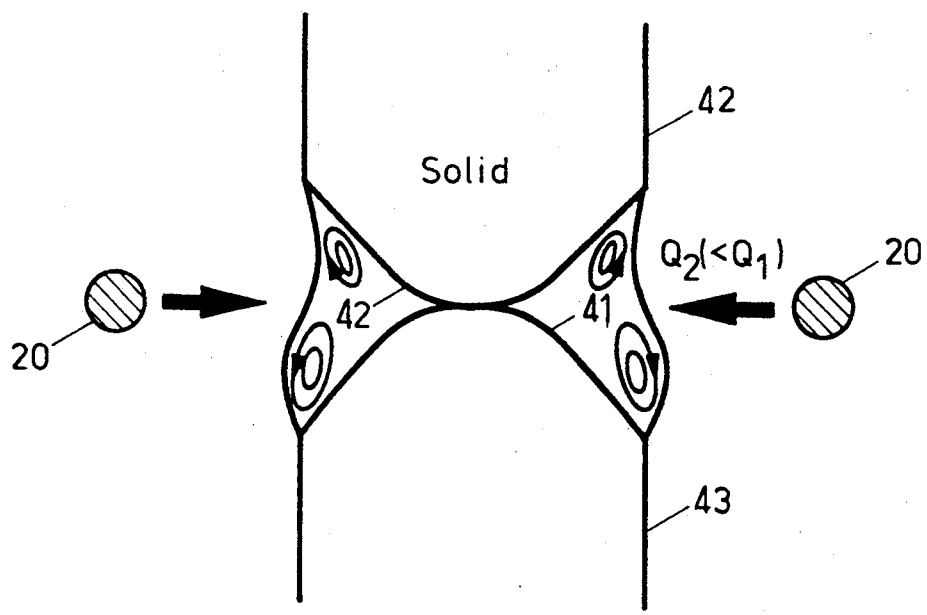
FIG. 5 is an illustrative schematic view of the melt zone between the rods as in FIG. 4 where relative rotation of the rods is stopped and the same heat input is provided as in FIG. 4.

When counterrotation is terminated, Marangoni convection dominates immediately. Consequently, for the same heat input $Q_2$, the zone length increases while the centerline of the melt zone freezes, as illustrated in FIG. 5, and the melt/solid interfaces eventually contact one another.

Figure 6:
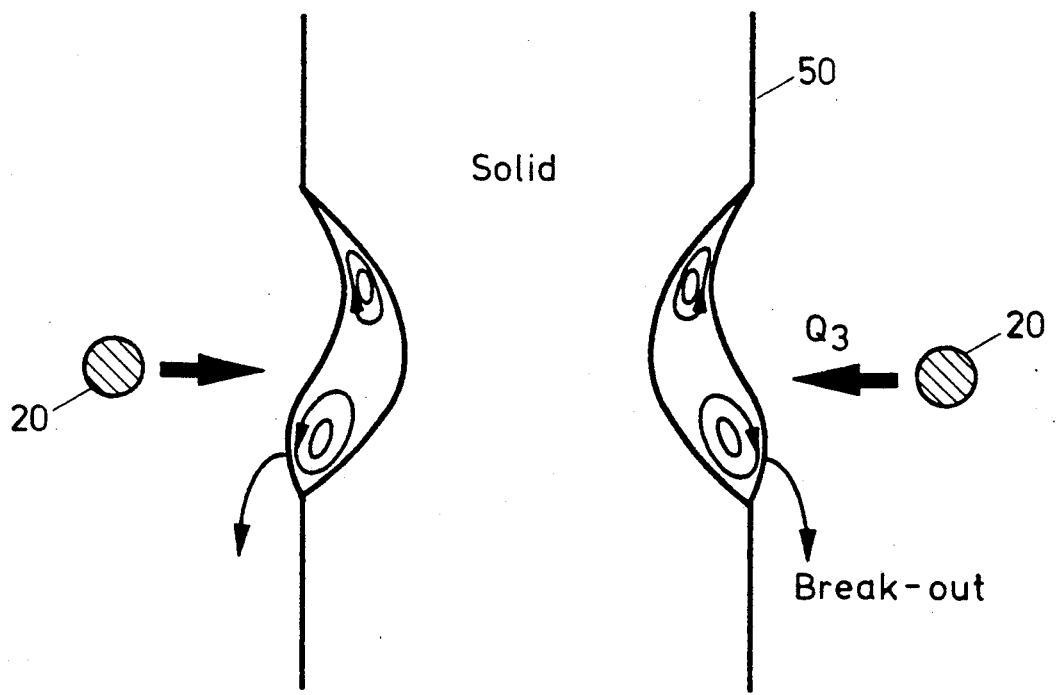
Figure 7:
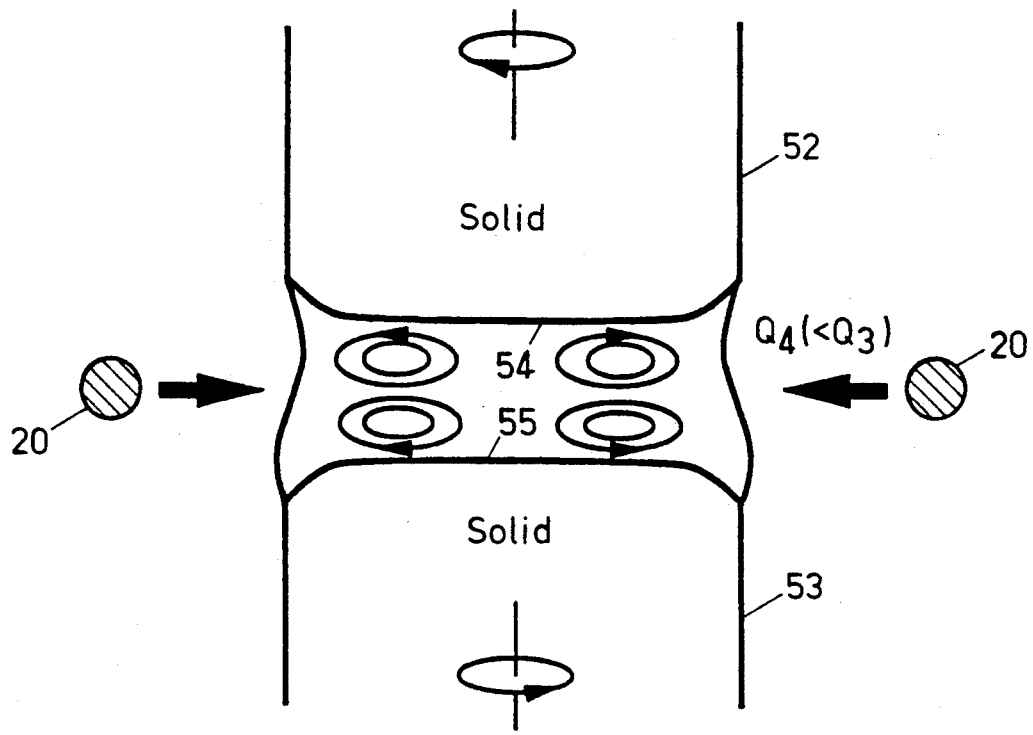
Figure 8:
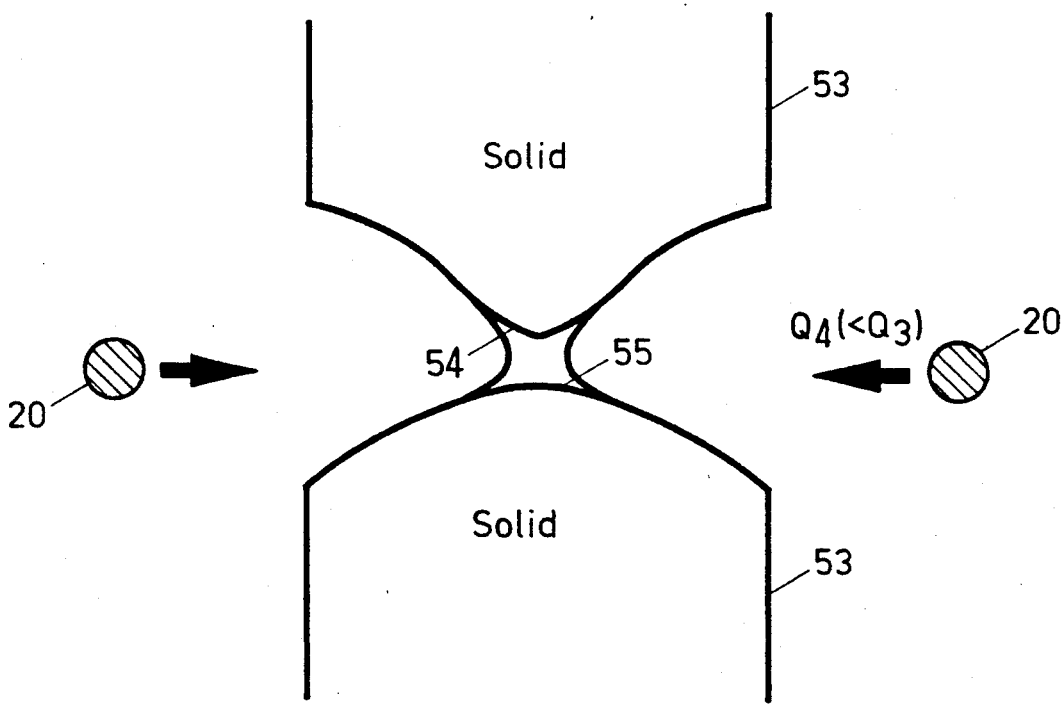
FIG. 8 is a schematic view of the melt zone as in FIG. 7 at the same heat input level but where the relative rotation of the feed and finish rods is stopped.

Similarly, the results for the case of even thicker rods (e.g., 10 mm diameter NaNO$_3$ rods) can be summarized in and explained with the help of FIGS. 6–8. Due to the influence of Marangoni convection and the fact that the rod diameter is significantly larger with no or slow rotation of a rod, the melt zone becomes too long and collapses before a single rod 50 is even melted through with a heat input $Q_3$, as illustrated in FIG. 6. With the help of a sufficiently fast counterrotation established between two rods 52 and 43, established as described above, a smaller heat input ($Q_4$) is sufficient to melt through the material and the resultant melt zone is short and very stable, as illustrated in FIG. 7. The melt/solid interfaces 54 and 55 of the two rods 52 and 53 are again substantially flat at the centers of the interfaces. Since the centrifugal force is proportional to the rod diameter, a slower counterrotation (i.e., 200 rpm) is sufficient for 10 mm diameter NaNO$_3$ rods. When counterrotation is terminated, Marangoni convection dominates immediately. Consequently, the melt zone becomes too long and collapses, as illustrated in FIG. 8.

As noted above, corotation (rotation of the rods in the same direction) did not result in a significant improvement in zone stability. With corotation the centrifugal force in the melt near the melt/solid interfaces is the same as that in the bulk melt. As such, a favorable convection pattern like that in FIG. 4 cannot develop in the melt zone.

Figure 9:
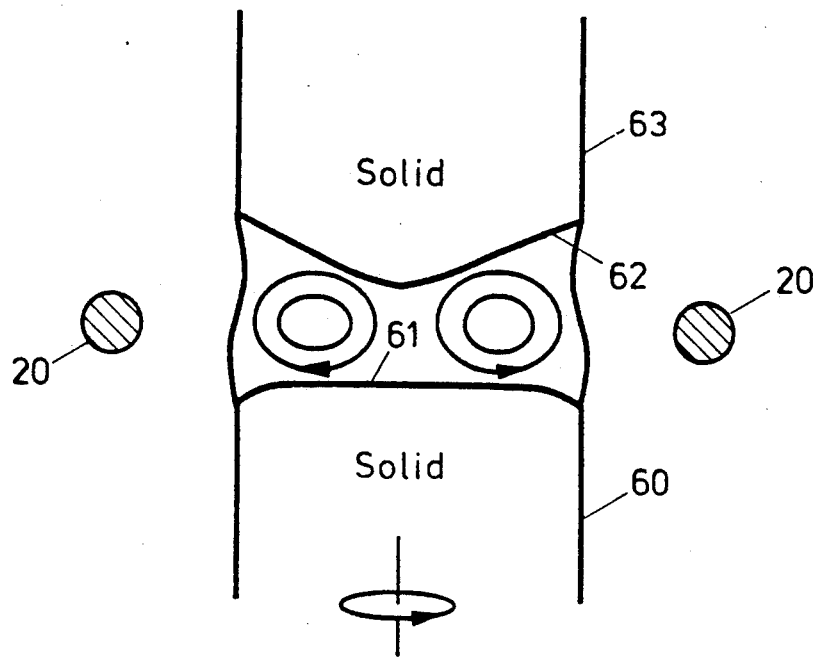
FIG. 9 is a simplified schematic view of a melt zone between a feed and finish rod where the feed rod is substantially stationary and the finish rod is rotated relative thereto.
Figure 10:
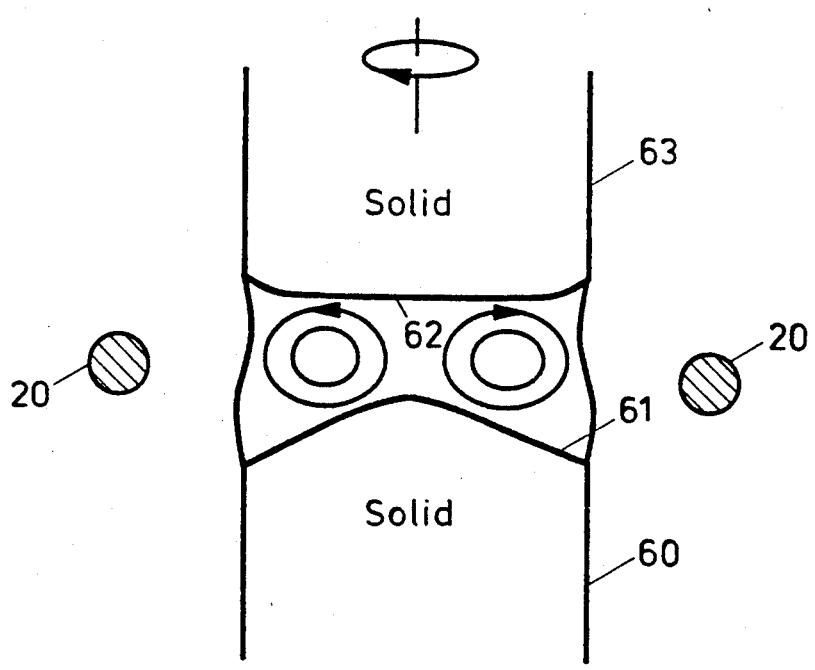
FIG. 10 is a simplified schematic view of the melt zone between a feed rod and a finish rod where the finish rod is maintained substantially stationary and the feed rod is rotated relative thereto.

The improvement in zone stability through the single rotation of one rod with respect to the other can be explained with the help of FIGS. 9 and 10. With single rotation of the lower rod 60, the centrifugal force in the melt is high near the lower melt/solid interface 61 but is zero near the upper melt/solid interface 62 of the upper rod 63. The resultant convection pattern in the melt is essentially like that shown in FIG. 9, if the single rotation is fast enough to let the forced convection dominate over Marangoni convection. This forced convection pattern causes the heat input to penetrate deep into the melt zone and meanwhile resists heat transfer along the free surface to the lower melt/solid interface 61. As a result, a smaller heat input is sufficient to melt through the material, and the melt zone is short and stable. The melt/solid interface 61 of the rotated rod is substantially flat at its center. Similar effects can be produced by single rotation of the upper rod 63, as illustrated in FIG. 10, which results in the upper interface 62 being substantially flat at its center.

It has been found that when rods of sufficiently large diameter are used in the present invention, the interfaces can actually become concave at their centers. As used herein, an interface is substantially flat at its center if forced convection is dominating over Marangoni convection so that the center of the interface displays little or no convexity or is concave.

It should be pointed out that the overall position of the melt zone with respect to the heater is higher with rotation of the lower rod than with rotation of the upper rod.

It may be noted that NaNO$_3$ has a high Prandtl number of around 9. The present invention is also, though not quite as, effective for low Prandtl-number materials such as metals and some semiconductors (e.g., Si).

Various types of heaters can be utilized to provide heating of the molten zone in addition to a resistance ring type heater. For example, an RF (radio frequency) coil can be used to heat up the ring, which can be formed of various materials such as tungsten or graphite. Such ring type heaters can melt both electrically conducting and non-conducting materials. Induction heaters can be used in a conventional fashion with electrically conducting materials. Various types of non-RF heating can also be used. A well known example is the so-called "mirror or image furnace" in which light given off by a halogen or arc lamp is reflected onto a zone on the sample rod surface and produces a floating zone. See, e.g., Roland Geray, et al., "Heating with Light," Cornell Engineering Quarterly, Autumn 1991, pp. 19–22; A. Eyer, et al., "A Double-Ellipsoid Mirror Furnace For Zone Crystallization Experiments In Spacelab," Journal of Crystal Growth, Vol. 47, 1979, pp. 219–229. Various heating techniques for zone refining are generally described in W. G. Pfann, *Zone Melting*, 2d Edition, John Wiley & Sons, Inc., 1966, pp. 107–117, and J. C. Brice, *The Growth of Crystals From Liquids*, North-Holland Publishing Company, 1973, pp. 269–274. These techniques include the use of laser and electron beams which are directed to form a zone on the sample rod surface to provide the floating zone.

Although the present invention is particularly advantageous in avoiding collapse of the molten zone when working under normal gravity, it also can be utilized in microgravity floating zone refining to improve the convection patterns in the melt zone.

It is understood that the invention is not confined to the embodiments set forth herein as illustrative, but embraces such modified forms as come within the scope of the following claims.

What is claimed is:

1. A method of growing a finish rod from a feed rod of material comprising the steps of:
    (a) establishing a melt zone between an initial finish rod section and the feed rod;
    (b) providing relative rotation of the feed rod and finish rod with respect to each other at a speed at least as great as 200 rpm while applying heat to the melt zone sufficient to maintain the melt zone;
    (c) traversing the feed rod with the melt zone while maintaining rotation of the feed rod and finish rod with respect to each other and applying heat to the melt zone sufficient to maintain the melt zone.

2. The method of claim 1 wherein the feed rod is held substantially stationary and the finish rod is rotated with respect thereto at a speed of at least 200 rpm.

3. The method of claim 1 wherein the finish rod is held substantially stationary and the feed rod is rotated with respect thereto at a speed of at least 200 rpm.

4. The method of claim 1 wherein the feed rod and the finish rod are both rotated in counter directions to each other at a relative rotational speed with respect to each other of at least 200 rpm.

5. The method of claim 1 wherein the feed rod and the finish rod are rotated with respect to each other at a relative rotational speed of about 400 rpm.

6. The method of claim 1 wherein the feed rod is formed of a polycrystalline material, the initial section of the finish rod is a crystalline seed mass of the same material, and wherein as the melt zone traverses the feed rod, the finish rod is grown as a monocrystalline body.

7. The method of claim 1 wherein the step of applying heat to the melt zone to maintain the melt zone comprises providing a ring heater spaced closely adjacent to the melt zone and activating the ring heater to heat the melt zone.

8. A method of growing a finish rod from a feed rod of material comprising the steps of:
(a) establishing a melt zone between the feed rod and an initial section of the finish rod;
(b) providing rapid relative rotation of the feed rod and finish rod with respect to one another at a selected speed while applying a selected heat to the melt zone, the speed of rotation of the rods relative to one another and the amount of heat applied to the melt zone being selected such that the aspect ratio of the melt zone is less than about 0.7; and
(c) traversing the feed rod with the melt zone to grow the finish rod from the molten material in the melt zone.

9. The method of claim 8 wherein the feed rod and finish rod are rotated relative to one another at a speed of at least 200 rpm.

10. The method of claim 8 wherein the feed rod is held substantially stationary and the finish rod is rotated with respect thereto at a speed of at least 200 rpm.

11. The method of claim 8 wherein the finish rod is held substantially stationary and the feed rod is rotated with respect thereto at a speed of at least 200 rpm.

12. The method of claim 8 wherein the feed rod and the finish rod are both rotated in counter directions to each other at a relative rotational speed with respect to each other of at least 200 rpm.

13. The method of claim 8 wherein the feed rod and the finish rod are rotated with respect to each other at a relative rotational speed of about 400 rpm.

14. The method of claim 8 wherein the feed rod is formed of a polycrystalline material, the initial section of the finish rod is a crystalline seed mass of the same material, and wherein as the melt zone traverses the feed rod, the finish rod is grown as a monocrystalline body.

15. The method of claim 8 wherein the step of applying heat to the melt zone comprises providing a ring heater spaced closely adjacent to the melt zone and activating the ring heater to heat the melt zone.

16. The method of claim 8 wherein the step of establishing a melt zone includes the steps of mounting the feed rod and an initial section of finish rod for rotation with facing ends of the two rods spaced closely together, applying heat to the facing ends of the two rods to melt the material of the facing ends, then bringing the two rods closer together to join the melted material on each rod.

17. The method of claim 16 wherein during the step of bringing the two rods closer together, providing a slow speed of rotation of the rods relative to one another.

18. The method of claim 17 wherein the slow speed of rotation is about 5 rpm.

19. A method of growing a finish rod from a feed rod of material comprising the steps of:
(a) mounting the feed rod and an initial section of finish rod for rotation with facing ends of the two rods spaced closely together;
(b) applying heat to the facing ends of the two rods to melt the material of the facing ends;
(c) then bringing the two rods closer together to join the melted material on each rod to establish a melt zone between the two rods while providing a slow speed of rotation of the rods relative to one another;
(d) then providing rapid relative rotation of the feed rod and finish rod with respect to one another at a selected speed while applying a selected heat to the melt zone, the speed of rotation of the rods relative to one another and the amount of heat applied to the melt zone being selected such that the melt zone is stable.

20. The method of claim 19 including the further step of traversing the feed rod with the melt zone to grow the finish rod from the molten material in the melt zone.

21. The method of claim 19 wherein the feed rod and finish rod are rotated relative to one another at a speed of at least 200 rpm.

22. The method of claim 19 wherein the feed rod and the finish rod are both rotated in counter directions to each other at a relative rotational speed with respect to each other of at least 200 rpm.

23. The method of claim 19 wherein the feed rod and the finish rod are rotated with respect to each other at a relative rotational speed of about 400 rpm.

24. The method of claim 20 wherein the feed rod is formed of a polycrystalline material, the initial section of the finish rod is a crystalline seed mass of the same material, and wherein as the melt zone traverses the feed rod, the finish rod is grown as a monocrystalline body.

25. The method of claim 19 wherein the slow speed of rotation is about 5 rpm.

26. A method of growing a finish rod from a feed rod of material comprising the steps of:
(a) establishing a melt zone between the feed rod and an initial section of the finish rod;
(b) providing rapid relative rotation of the feed rod and finish rod with respect to one another at a selected speed while applying a selected heat to the melt zone, the speed of rotation of the rods relative to one another and the amount of heat applied to the melt zone being selected such that the melt zone is stable, the melt/solid interfaces of the two rods do not contact each other, and at least one of the interfaces is substantially flat at its center; and
(c) traversing the feed rod with the melt zone to grow the finish rod from the molten material in the melt zone.

27. The method of claim 26 wherein the feed rod and finish rod are rotated with respect to one another at a speed of at least 200 rpm.

28. The method of claim 26 wherein the feed rod is held substantially stationary and the finish rod is rotated with respect thereto at a speed of at least 200 rpm.

29. The method of claim 26 wherein the finish rod is held substantially stationary and the feed rod is rotated with respect thereto at a speed of at least 200 rpm.

30. The method of claim 26 wherein the feed rod and the finish rod are both rotated in counter directions to each other at a relative rotational speed sufficient so that each of the melt/solid interfaces of the two rods is substantially flat at its center.

31. The method of claim 26 wherein the feed rod and the finish rod are rotated with respect to each other at a relative rotational speed of about 400 rpm.

32. The method of claim 26 wherein the feed rod is formed of a polycrystalline material, the initial section of the finish rod is a crystalline seed mass of the same material, and wherein as the melt zone traverses the feed rod, the finish rod is grown as a monocrystalline body.

33. The method of claim 26 wherein the step of applying heat to the melt zone comprises providing a ring heater spaced closely adjacent to the melt zone and activating the ring heater to heat the melt zone.

34. The method of claim 26 wherein the step of establishing a melt zone includes the steps of mounting the feed rod and an initial section of finish rod for rotation with facing ends of the two rods spaced closely together, applying heat to the facing ends of the two rods to melt the material of the facing ends, then bringing the two rods closer together to join the melted material on each rod.

35. The method of claim 34 wherein during the step of bringing the two rods closer together, providing a slow speed of rotation of the rods relative to one another.

36. The method of claim 35 wherein the slow speed of rotation is about 5 rpm.

* * * * *